(12) United States Patent
Yeo

(10) Patent No.: US 9,035,660 B2
(45) Date of Patent: May 19, 2015

(54) JIG FOR MEASURING EMC OF SEMICONDUCTOR CHIP AND METHOD FOR MEASURING EMC OF SEMICONDUCTOR CHIP USING THE SAME

(71) Applicant: Electronics and Telecommunications Research Institute, Daejeon (KR)

(72) Inventor: Soon Il Yeo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 333 days.

(21) Appl. No.: 13/672,858

(22) Filed: Nov. 9, 2012

(65) Prior Publication Data

US 2013/0193983 A1 Aug. 1, 2013

(30) Foreign Application Priority Data

Jan. 27, 2012 (KR) .................. 10-2012-0008210

(51) Int. Cl.
*G01R 27/28* (2006.01)
*G01R 31/02* (2006.01)
*G01R 1/04* (2006.01)
*G01R 31/00* (2006.01)

(52) U.S. Cl.
CPC ........ *G01R 1/04* (2013.01); *G01R 27/28* (2013.01); *G01R 1/0408* (2013.01); *G01R 31/002* (2013.01)

(58) Field of Classification Search
CPC ........ G01R 1/04; G01R 1/0408; G01R 31/00; G01R 31/002; G01R 31/003; G01R 31/1263; G01R 31/26; G01R 31/2601; G01R 31/2642; G01R 31/2644; G01R 31/275; G01R 31/281; G01R 31/2817; G01R 31/2849; G01R 27/28; G01R 27/32; G01R 13/34

USPC ........ 324/612, 600, 762.01, 762.02, 762.03, 324/762.04, 762.05, 762.06, 762.08, 324/762.09, 555
See application file for complete search history.

(56) References Cited

U.S. PATENT DOCUMENTS 6,400,160 B1 * 6/2002 Sampath .................. 324/613
6,967,486 B2 * 11/2005 Schneider ................. 324/503
(Continued)

FOREIGN PATENT DOCUMENTS

KR 10-2011-0065153 A 6/2011
KR 10-2011-0098563 A 9/2011

OTHER PUBLICATIONS

S. Criel et al., "Accurate Characterization of Some Radiative EMC Phenomena at Chip Level, Using Dedicated EMC-testchips", IEEE, Aug. 24-28, 1998, pp. 734-738, vol. 2.

*Primary Examiner* — Hoai-An D Nguyen
(74) *Attorney, Agent, or Firm* — Rabin & Berdo, P.C.

(57) ABSTRACT

Disclosed are a jig for measuring EMC of a semiconductor chip and a method for measuring EMC that can accurately measure the EMC at a semiconductor chip level. The jig for measuring EMC of a semiconductor chip according to the exemplary embodiment of the present disclosure includes: a chip mount unit on which the semiconductor chip for which the EMC is to be measured is mounted; a memory unit configured to store EMC information of components in a system in which the semiconductor chip is used; and a measurement control unit configured to extract the EMC information stored in the memory unit and provide the extracted EMC information to the chip mount unit at the time of measuring the EMC of the semiconductor chip.

9 Claims, 2 Drawing Sheets

(56) References Cited

U.S. PATENT DOCUMENTS

2006/0043979 A1 3/2006 Wu
2008/0084218 A1 4/2008 Hailey et al.
2010/0207641 A1* 8/2010 Hailey et al. .................. 324/555
2013/0082717 A1* 4/2013 Kim et al. ..................... 324/537

* cited by examiner

JIG FOR MEASURING EMC OF SEMICONDUCTOR CHIP AND METHOD FOR MEASURING EMC OF SEMICONDUCTOR CHIP USING THE SAME

CROSS-REFERENCE TO RELATED APPLICATIONS

This application is based on and claims priority from Korean Patent Application No. 10-2012-0008210, filed on Jan. 27, 2012, with the Korean Intellectual Property Office, the disclosure of which is incorporated herein in its entirety by reference.

TECHNICAL FIELD

The present disclosure relates to a jig for measuring electro magnetic compatibility (EMC) at a semiconductor chip level and a method for measuring EMC using the same.

BACKGROUND

EMC means the capability of electronic equipment that can coexist with other equipment under an environment in which electronic equipment generates without mutually causing degradation or loss of function. Today, electronic equipment manufactured in international markets needs to coincide with numerous regulations associated with the EMC and product stability presented by governmental organizations, private standard groups, self-regulation associations and the like.

EMC measurement in the related art is generally performed at a printed circuit board level, that is, a system level, and for the EMC measurement, a TEM cell (including a GTEM cell) method, a surface scan method, a bulk current injection (BCI) method, a direct power injection (DPI) method, a workbench Faraday cage method and the like are used. However, the influence of each of internal semiconductor chips or components cannot be known by the system-level measurement.

A method using a jig on which the semiconductor chips can be mounted may be considered in order to measure EMC at a semiconductor chip level. However, when a general jig in the related art is used, it is difficult to reflect a real operation situation of the system in the EMC measurement, and as a result, it is difficult to accurately measure the EMC with respect to the semiconductor chip.

As one example, a case of measuring EMC of a chip for a micro controller unit 105 used in a tire pressure monitoring system (TPMS) 100 among automobile semiconductor chips will be described through FIG. 1.

As illustrated in FIG. 1, the TPMS 100 further includes a sensor for sensing the pressure of a tire and an analog/digital converter 103 for transferring a sensed signal to the MCU 105 in addition to the MCU 105.

Among them, when a jig mounted with the MCU 105 is manufactured in order to measure EMC of the chip for the MCU 105, according to the related art, only the MCU 105 is mounted on the jig, and as a result, interactions with other components including the tire pressure sensor 101, the A/D converter 103, and the like constituting the TPMS 100 are not considered. Since the components have different characteristics for each model of each manufacturing company, EMC characteristics thereof have no choice but to be different, but the jig is manufactured without considering the matters.

SUMMARY

The present disclosure has been made in an effort to provide a jig for measuring EMC of a semiconductor chip and a method for measuring EMC that can accurately measure the EMC at a semiconductor chip level by providing means that can allow various operation environments of a system in which the semiconductor chip is used into a database and store the database within a jig.

An exemplary embodiment of the present disclosure provides a jig for measuring EMC of a semiconductor chip, including: a chip mount unit on which the semiconductor chip for which the EMC is to be measured is mounted; a memory unit configured to store EMC information of components in a system in which the semiconductor chip is used; and a measurement control unit configured to extract the EMC information stored in the memory unit and provide the extracted EMC information to the chip mount unit at the time of measuring the EMC of the semiconductor chip. The jig may further include: a signal input unit configured to receive a plurality of control signals for driving the jig; and a measurement result output unit configured to output the measurement result of the EMC for the semiconductor chip.

The chip mount unit may implement various operation environments of the system in which the semiconductor chip is used by using the EMC information provided from the memory unit at the time of measuring the EMC of the semiconductor chip.

The memory unit may include: a general database configured to store information required for a general function test of the semiconductor chip; an EMC database configured to make EMC information of components in the system according to an operation situation of the system into a database and store the EMC data; a data selection unit configured to provide the information stored in the general database or the EMC database to the chip mount unit by the control of the measurement control unit; and a measurement database configured to store a measurement result of the chip mount unit.

Another exemplary embodiment of the present disclosure provides a method for measuring EMC of a semiconductor chip, including: mounting the semiconductor chip for which the EMC is to be measured on a jig; implementing predetermined operation environments of a system in which the semiconductor chip is used through the jig; and measuring the EMC of the semiconductor chip under the implemented operation environments.

According to the exemplary embodiments of the present disclosure, the EMC can be measured at the level of each of the semiconductor chips constituting the system.

EMC information on the components in the system in which the semiconductor chip is used is made into the database and stored in the memory of the jig, and the information stored at the time of measuring EMC is used to measure the EMC of the semiconductor chip while various real operation environments of the system are reflected.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
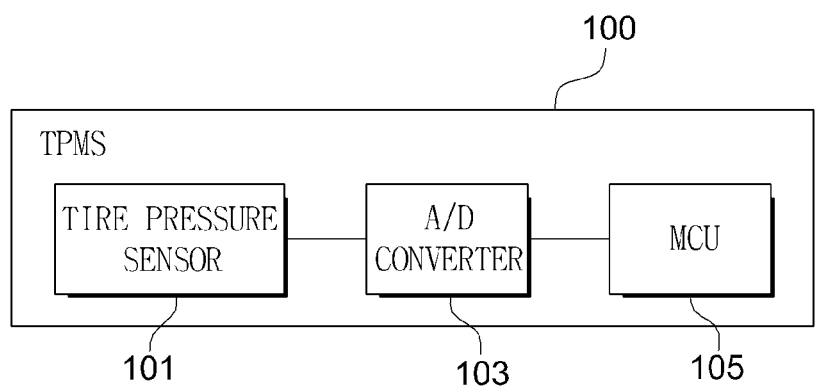
FIG. 1 is a schematic configuration diagram of a general TPMS.
Figure 2:
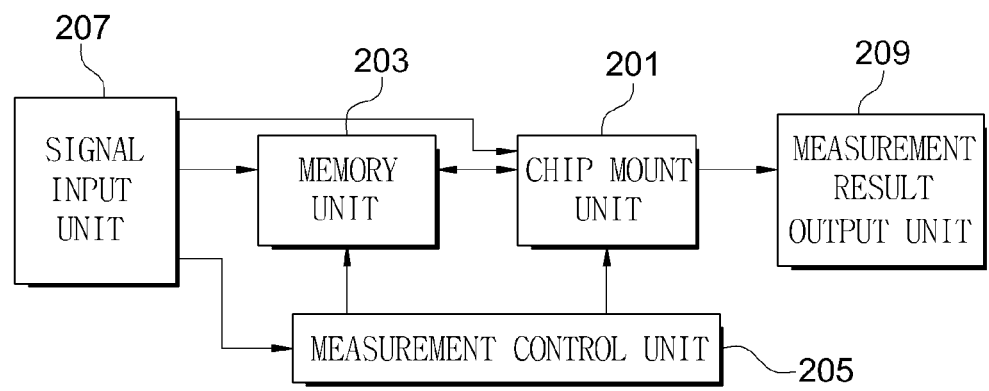
FIG. 2 is a configuration diagram of a jig for measuring EMC according to an exemplary embodiment of the present disclosure.

FIG. 2 is a configuration diagram of a jig for measuring EMC according to an exemplary embodiment of the present disclosure.

Referring to FIG. 2, a jig for measuring EMC according to an exemplary embodiment of the present disclosure includes a chip mount unit 201 on which a semiconductor chip for which the EMC is to be measured is mounted, a memory unit 203 configured to store EMC information of components in a system in which the semiconductor chip is used, a measurement control unit 205 configured to extract the EMC information stored in the memory unit 203 and provide the extracted EMC information to the chip mount unit 201 at the time of measuring the EMC of the semiconductor chip, a signal input unit 207 configured to receive a plurality of control signals for driving the jig and a measurement result output unit 209 configured to output an EMC measurement result for the semiconductor chip.

In the present disclosure, EMC information under various operation situations of the components in the system in which the semiconductor chip for which the EMC is to be measured is used is made into a database and is stored in the memory unit 203, and the EMC information stored in the memory unit 203 is referred at the time of measuring the EMC of the semiconductor chip so as to reflect an operating environment in an actually implemented system as it is.

The signal input unit 207 receives a plurality of control signals including all signals for driving the jig, that is, a mode signal for determining whether the EMC is measured for the semiconductor chip, a clock signal for synchronizing the jig and the semiconductor chip, a voltage signal for driving the memory unit 203 and a reset signal and transfers the received control signals to the respective components in the jig. Herein, it may be determined by the mode signal whether the EMC of the semiconductor chip mounted on the jig will be measured or whether a general function test will be performed.

Figure 3:
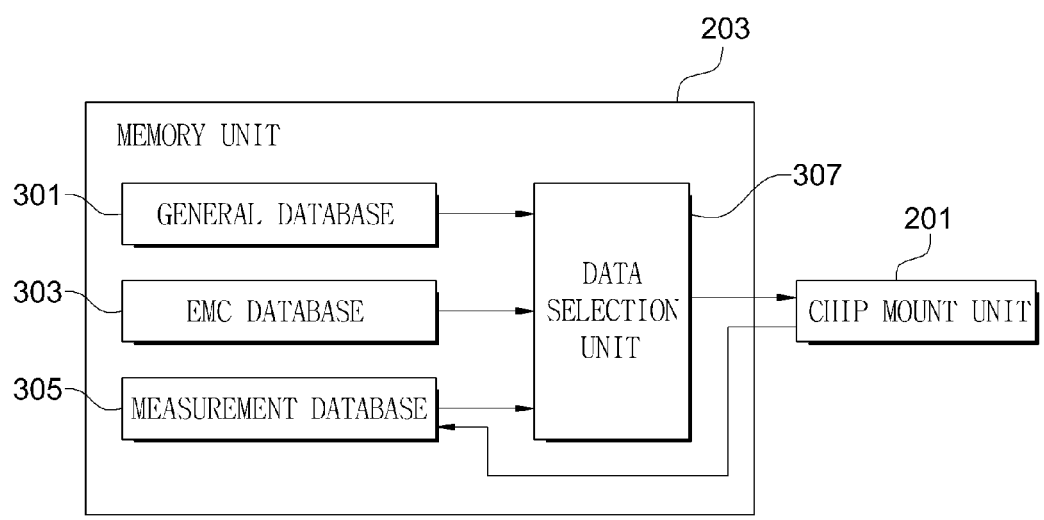
FIG. 3 is a configuration diagram illustrating a memory unit 203 of FIG. 2 in detail.

FIG. 3 is a configuration diagram illustrating the memory unit 203 of FIG. 2 in detail.

Referring to FIG. 3, the memory unit 203 of the jig for measuring EMC according to the exemplary embodiment of the present disclosure includes a general database 301, an EMC database 303, a measurement database 305 and a data selection unit 307.

Information required for the general function test of the semiconductor chip is stored in the general database 301 and the EMC information of the components in the system according to various operation situations of the system is made into the database and stored in the EMC database 303. The data selection unit 307 provides the information stored in the general database 301 or the EMC database 303 to the chip mount unit 201 by the control of the measurement control unit 205.

In detail, only the information stored in the general database 301 may be extracted to be transferred to the chip mount unit 201 through the data selection unit 307 at the time of performing the general function test of the semiconductor chip mounted on the jig, and the information stored in the general database 301 and the information stored in the EMC database 303 may be together extracted to be transferred to the chip mount unit 201 through the data selection unit 307 at the time of measuring EMC of semiconductor chip.

The measurement database 305 stores a measurement result of the chip mount unit 201. In this case, for more precise measurement, an intermediate result may be stored even when measurement is in progress in the chip mount unit 201. For example, when a measurement range intends to be increased by a method of increasing a clock frequency during the measurement, previous measurement data may be temporarily stored so as to compare measurement results in different ranges after the measurement is completely terminated.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A jig for measuring electro magnetic compatibility (EMC) at a semiconductor chip level, comprising:
    a chip mount unit on which a semiconductor chip, for which the EMC is to be measured, is mounted; and
    a memory unit storing various operation environments including EMC information of components in the same operation environment of the same system in which the semiconductor chip is used, each of the components being different from all other of the components and having different EMC characteristics from all the other of the components,
    wherein the same operation environment of the same system, in which the semiconductor chip is used, is implemented in the chip mount unit at a time of measuring the EMC of the semiconductor chip by using the EMC information.

2. A jig for measuring electro magnetic compatibility (EMC) at a semiconductor chip level, comprising:
    a chip mount unit on which a semiconductor chip, for which the EMC is to be measured, is mounted;
    a memory unit configured to store EMC information of components in a system in which the semiconductor chip is used; and
    a measurement control unit configured to extract the EMC information stored in the memory unit and provide the extracted EMC information to the chip mount unit at a time of measuring the EMC of the semiconductor chip.

3. The jig of claim 2, wherein the chip mount unit implements various operation environments of the system in which the semiconductor chip is used by using the EMC information provided from the memory unit at the time of measuring the EMC of the semiconductor chip.

4. The jig of claim 2, wherein the memory unit includes:
    a general database configured to store general information required for a general function test of the semiconductor chip;
    an EMC database configured to store EMC information of components in the system according to an operation situation of the system into a database;
    a data selection unit configured to provide the general or EMC information stored in the general database or the EMC database to the chip mount unit by control of the measurement control unit; and a measurement database configured to store a measurement result of the chip mount unit.

5. The jig of claim 2, further comprising:
a signal input unit configured to receive a plurality of control signals for driving the jig; and
a measurement result output unit configured to output the measurement result of the EMC for the semiconductor chip.

6. The jig of claim 5, wherein the plurality of control signals includes a mode signal for determining whether the EMC for the semiconductor chip is measured, a clock signal for synchronizing the jig with the semiconductor chip and a voltage signal for driving the memory unit.

7. The jig according to claim 2, wherein a group of the components are each different from one another, and each of the group of the components has EMC characteristics different from all other components of the group of the components, the group of the components being used in the same operating environment.

8. A method for measuring electro magnetic compatibility (EMC) of a semiconductor chip, comprising:
mounting the semiconductor chip for which the EMC is to be measured on a jig;
implementing predetermined operation environments of a system in which the semiconductor chip is used through the jig, wherein the jig stores EMC information of components in the system according to an operation situation of the system and implements the predetermined operation environments of the system by using the stored EMC information; and
measuring the EMC of the semiconductor chip under the implemented operation environments.

9. The method according to claim 8, wherein a group of the components are each different from one another, and each of the group of the components has EMC characteristics different from all other components of the group of the components, the group of the components being used in the same one of the predetermined operation environments.

* * * * *